United States Patent [19]

Lifshitz et al.

[11] 4,333,793
[45] Jun. 8, 1982

[54] HIGH-SELECTIVITY PLASMA-ASSISTED ETCHING OF RESIST-MASKED LAYER

[75] Inventors: Nadia Lifshitz, New Providence; Joseph M. Moran, Berkeley Heights, both of N.J.; David N. Wang, Cupertino, Calif.

[73] Assignee: Bell Telephone Laboratories, Incorporated, Murray Hill, N.J.

[21] Appl. No.: 199,023

[22] Filed: Oct. 20, 1980

[51] Int. Cl.³ .. B44C 1/22; C03C 15/00; C03C 25/06
[52] U.S. Cl. .................................... 156/643; 156/646; 156/659.1; 204/192 EC; 204/192 E; 252/79.1; 427/40; 427/43.1
[58] Field of Search ............ 156/643, 646, 657, 659.1, 156/661.1, 662; 204/164, 192 EC, 192 E, 298; 430/313, 317; 427/38, 39, 40, 41, 43.1; 252/79.1

[56] References Cited

U.S. PATENT DOCUMENTS

| | | | |
|---|---|---|---|
| 3,816,196 | 6/1974 | La Combe | 204/164 X |
| 3,940,506 | 2/1976 | Heinecke | 156/643 X |
| 4,226,896 | 10/1980 | Coburn et al. | 427/34 |
| 4,244,799 | 1/1981 | Fraser et al. | 204/192 E |
| 4,275,286 | 6/1981 | Hackett | 219/121 EK |

OTHER PUBLICATIONS

The Bell System Technical Journal, vol. 58, No. 5, May-Jun. 1979, High Resolution Steep Profile Resist Patterns, by Moran et al., pp. 1027-1036.

Primary Examiner—William A. Powell
Attorney, Agent, or Firm—Lucian C. Canepa

[57] ABSTRACT

In a VLSI device fabrication process, erosion of a patterned resist layer (16, 18) during dry etching of an underlying layer (14) can significantly limit the high-resolution patterning capabilities of the process. As described herein, a protective polymer layer (60, 62) is formed and maintained only on the resist material (16, 18) while the underlying layer (14) is being etched. High etch selectivities are thereby achieved. As a consequence, very thin resist layers can be utilized in the fabrication process and very-high-resolution patterning for VLSI devices is thereby made feasible.

9 Claims, 4 Drawing Figures

HIGH-SELECTIVITY PLASMA-ASSISTED ETCHING OF RESIST-MASKED LAYER

BACKGROUND OF THE INVENTION

This invention relates to the fabrication of very-large-scale-integrated (VLSI) devices and, more particularly, to a technique for achieving high selectivity while dry etching a layer that is masked by a thin resist pattern.

A particularly advantageous VLSI device fabrication process characterized by submicron resolution with excellent linewidth control and step coverage is described in J. M. Moran and D. Maydan in "High Resolution, Steep Profile, Resist Patterns", in *The Bell System Technical Journal*, Vol. 58, No. 5, May–June 1979, pp. 1027–1036. This technique, which is sometimes referred to as the trilevel process, is also described in a commonly assigned copending U.S. application of D. B. Fraser, D. Maydan and J. M. Moran designated Ser. No. 941,369, filed Sept. 11, 1978, now U.S. Pat. No. 4,244,799. In the trilevel process, a relatively thin layer must be selectively etched using a thin high-resolution resist pattern as the mask therefor. The relatively thin layer comprises, for example, a 0.12-micrometers (μm)-thick film of silicon dioxide ($SiO_2$).

When the trilevel process is utilized for micron and submicron pattern transfer, the material employed to form the required thin high-resolution resist pattern therein is typically an electron-sensitive resist such as poly(glycidyl methacrylate-co-ethyl acrylate) also known as COP or poly(olefin sulfone) also known as PBS or an X-ray-sensitive resist such as a mixture of poly(2,3-dichloro-1-propyl acrylate) and poly(glycidyl methacrylate-co-ethyl acrylate) also known as DCOPA. As masking materials, these high-resolution resists do not, however, always exhibit a sufficiently high resistance to the dry etching processes typically utilized to etch the underlying $SiO_2$ layer. Thus, for example, when resist-masked $SiO_2$ is patterned in a reactive sputter etching step in a $CHF_3$ plasma, the $SiO_2$-to-resist etch ratio (etch selectivity) is in practice sometimes so low that the loss of linewidth that results from resist erosion during pattern transfer is unacceptably high for some VLSI device fabrication purposes.

Accordingly, continuing efforts have been made by workers in the VLSI device fabrication field directed at trying to improve the aforespecified etch selectivity. It was recognized that such efforts, if successful, would make it feasible to utilize extremely thin resist masks in a device fabrication process characterized by high-resolution features with excellent linewidth control.

SUMMARY OF THE INVENTION

Hence, an object of the present invention is a technique for improving the etch selectivity of a device fabrication sequence in which a pattern defined in a resist mask is transferred in a dry etching step into an underlying layer.

Briefly, this and other objects of the present invention are realized in a specific illustrative VLSI device fabrication sequence in which a protective polymer layer is formed and maintained on a mask pattern made of a resist material while an underlying layer is being etched to define mask-specified features therein.

In one particular embodiment of the invention, the mask pattern is made of PBS, COP or DCOPA and the underlying layer is made of $SiO_2$. Reactive sputter etching of the $SiO_2$ layer is carried out in a plasma that contains at least fluorine and hydrogen species. In some cases, the plasma also contains nitrogen. The etching parameters are adjusted such that the protective polymer is formed and maintained on the resist material but not on the $SiO_2$. As a result, virtually no erosion of the resist pattern occurs during etching.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
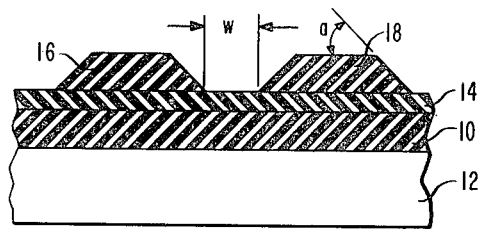
FIG. 1 is a schematic representation in cross-section of a portion of a known VLSI structure that includes a resist-masked layer to be etched.

FIG. 1 represents a portion of a conventional VLSI structure (not to scale) at an intermediate point in the fabrication cycle thereof utilizing the aforespecified trilevel process. A thick organic layer 10 is shown deposited on a silicon substrate 12. Illustratively, the layer 10 comprises a 2.6-μm-thick layer of a standard photoresist such as HPR-206 made by the Hunt Chemical Company. On top of the layer 10 is a relatively thin intermediate layer 14 comprising, for example, a 0.12-μm-thick layer of plasma-deposited silicon dioxide ($SiO_2$). Lastly, a masking pattern comprising elements 16 and 18 is shown on the intermediate layer 14.

The regions of the intermediate layer 14 to be etched are not covered with resist material. As indicated in FIG. 1, one such region to be etched is defined between the resist elements 16 and 18. This region has a prescribed width w. Ideally, the region to be anisotropically etched in the layer 14 and, subsequently, the portion to be anisotropically etched in the relatively thick layer 10 should each have the same width w. If deviations from that width occur, the VLSI device being fabricated will vary from prescribed specifications.

By way of example, the pattern comprising the elements 16 and 18 (FIG. 1) is formed by initially depositing a 0.7-μm-thick layer of a standard high-resolution resist such as DCOPA on the layer 14. After conventional pattern exposure and development steps, the thickness of the initially deposited resist is reduced to, for example, 0.35 μm. Moreover, after these steps only the masking elements 16 and 18 shown in FIG. 1 remain on the layer 14.

In practice, the edges of the elements 16 and 18 constituting the aforedescribed resist pattern are typically sloped as shown in FIG. 1. With a resist such as DCOPA, the angle a in FIG. 1 approximates 45 degrees. The etch resistance of DCCPA and some other high-resolution resists such as PBS and COP relative to that of $SiO_2$ in a standard etching plasma of, say, $CHF_3$ is relatively low. Hence, while the intermediate layer 14 is being anisotropically etched in such a plasma, side portions of the resist elements are also removed. This, of course, results in an undesired loss in linewidth.

Figure 2:
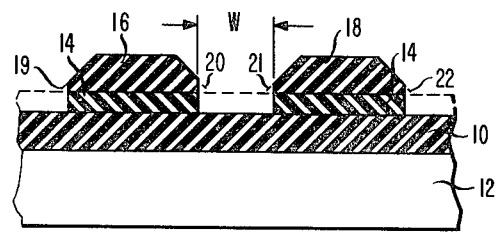
FIG. 2 shows the FIG. 1 structure after etching of the resist-masked layer has been carried out in a conventional manner.

FIG. 2 illustrates the manner in which etching of side portions of the resist elements 16 and 18 causes the region removed from the layer 14 between the elements to have a width W that is greater than the prescribed width w shown in FIG. 1. (Other regions defined by the resist mask in the layer 14 are, of course, similarly affected). In one actual case, the prescribed width w was 0.7 μm, whereas the width W actually achieved in the layer 14 as a result of plasma etching was 1.0 μm. In FIG. 2, the side portions 19, 20, 21 and 22 that are etched away from the elements 16 and 18, respectively, are shown in dashed outline.

In accordance with the principles of applicants' invention, virtually none of the patterned resist layer is eroded during the step in which mask-defined regions of the layer 14 are dry etched. Uniquely, this is done by forming and maintaining a protective layer only on the elements of the resist pattern during the etching operation. The exposed regions of the layer 14 are not so protected and are, accordingly, etched away. As a result, the pattern actually transferred from the resist mask layer into the layer 14 is a more faithful replica of the pattern defined in the resist than heretofore achieved in practice.

Figure 3:
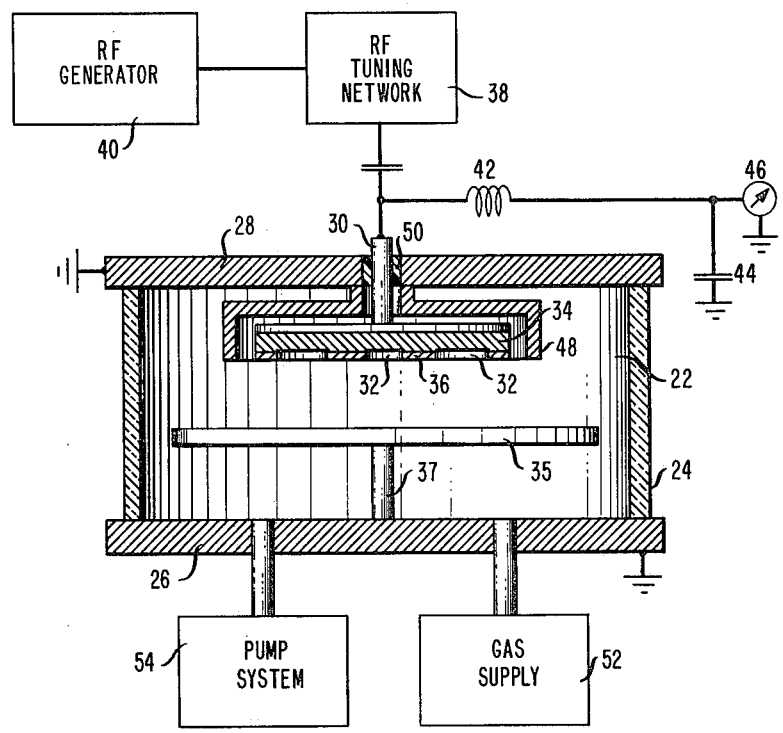
FIG. 3 depicts a specific illustrative system for etching VLSI structures.

Illustratively, applicants' inventive etching process is carried out in a parallel-plate reactive sputter etching system of the type schematically represented in FIG. 3. The depicted system comprises an etching chamber 22 defined by a cylindrical conductive member 24 and two conductive end plates 26 and 28. A water-cooled conductive workpiece holder or cathode 30 is mounted in the chamber 22. Wafers 32, whose bottom surfaces are to be etched, are mounted on the bottom surface of a conductive plate 34 that is secured to the cathode 30 by any standard instrumentality (not shown) such as clamps or screws. The wafers 32 are maintained in place on the plate 34 by a cover plate 36 having apertures therethrough. Advantageously, the plate 36 is made of a low-sputter-yield material that does not react chemically with the etching gas to form a nonvolatile material. Suitable such materials include fused quartz and plexiglass. Or the plate 36 may comprise a metallic member made, for example, of aluminum having a layer of silicon coated thereon.

The apertures in the plate 36 are positioned in aligned registry with the wafers 32 and are each slightly smaller in diameter than the respectively aligned wafers. In that way, a major portion of the surface of each wafer is exposed for etching. By any standard means, the cover plate 36 is secured to the plate 34.

The FIG. 3 reactor also includes a conductive anode 35. The anode 35 is mechanically supported and electrically connected to the end plate 26 by a conductive post 37.

The cathode 30 of FIG. 3 is capacitively coupled via a radio-frequency tuning network 38 to a radio-frequency generator 40 which, by way of example, is designed to drive the cathode 30 at a frequency of 13.56 megahertz. Further, the cathode 30 is connected through a filter network, comprising an inductor 42 and a capacitor 44, to a meter 46 that indicates the peak value of the radio-frequency voltage applied to the cathode 30.

In FIG. 3, the end plates 26 and 28 are shown connected to a point of reference potential such as ground. Accordingly, the anode 35 is also in effect connected to ground. The neck portion of the cathode 30 that extends through the plate 28 is electrically insulated from the plate 28 by a nonconductive bushing 50. Additionally, an open-ended cylindrical shield 34 surrounding the cathode 30 is connected to the plate 28 and thus to ground.

In one specific illustrative reactor of the type shown in FIG. 3 adapted to carry out applicants' inventive process, the anode-to-cathode separation was approximately 10 centimeters. In that reactor, the diameter of the plate 34 was about 25 centimeters and the diameter of the anode 35 was approximately 43 centimeters. The bottom of the plate 34 was designed to have seven 3-inch wafers to be etched placed thereon.

In accordance with the principles of the present invention, a specified gas atmosphere is established in the chamber 22 of FIG. 3. Gas is controlled to flow into the indicated chamber from a supply 52. Additionally, a prescribed low pressure condition is maintained in the chamber by means of a conventional pump system 54.

By introducing a particular gas or mixture of gases into the chamber 22 (FIG. 3) and establishing an electrical field between the cathode 30 and the anode 35, as specified in particular detail below, a reactive plasma is generated in the chamber 22. Volatile products formed at the workpiece surfaces during the etching process are exhausted from the chamber by the system 54.

In accordance with the principles of the present invention, a polymer material is formed and maintained on the aforedescribed resist elements 16 and 18, but not on the exposed regions of the layer 14, during plasma etching. This is accomplished by establishing a particular set of process conditions in the aforedescribed reactor.

In one specific illustrative case that embodies the principles of this invention, plasma etching of a resist-masked layer of $SiO_2$ was carried out with negligible erosion of the resist pattern. The layer of $SiO_2$ was approximately 0.12 μm thick, and the resist masking elements were made of DCOPA or PBS or COP approximately 0.35 μm thick. By way of example, the gases introduced into the chamber 22 (FIG. 3) from the supply 52 comprised a mixture of $CHF_3$, $H_2$ and $N_2$. In one particular illustrative case, the flow rates of the gases introduced into the chamber 22 were: $CHF_3$, 11.6 cubic centimeters per minute; $H_2$, 2.4 cubic centimeters per minute; and $N_2$, 0.6 cubic centimeters per minute. In addition, the pressure within the chamber 22 was established at approximately 7 μm, and the input power at the surface of the cathode was set at about 0.2 watts per square centimeter. Under these conditions, the $SiO_2$ layer was etched at a rate of approximately 215 Angstrom units per minute. Significantly, the resist elements remained virtually dimensionally intact during the etching step.

Figure 4:
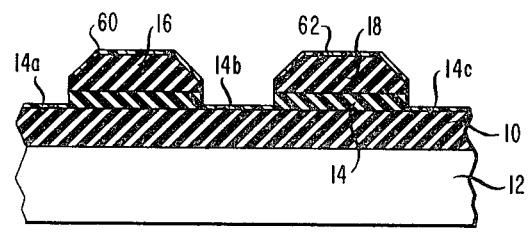
FIG. 4 shows the FIG. 1 structure after etching of the resist-masked layer thereof has been carried out in accordance with the principles of this invention.

The selective deposition of a polymer film on the resist elements during applicants' etching process is represented in FIG. 4. Thin protective films 60 and 62 (typically about 400-to-500 Angstrom units thick) are shown respectively covering the top surfaces of the previously specified resist elements 16 and 18. Midway during the anisotropic etching process, about one-half of the deposited layer 14 of $SiO_2$ has been removed from the structure being processed. These partially removed regions of the layer 14 are designated 14a, 14b and 14c in FIG. 4. As indicated in FIG. 4, no polymer film exists on the unmasked regions 14a, 14b and 14c during etching.

Subsequently, as a result of the above-specified etching process, the $SiO_2$ regions 14a, 14b and 14c shown in FIG. 4 are completely removed, thereby exposing the surfaces of specified regions of the underlying layer 10 for processing. Importantly, since the masking pattern comprising the resist elements 16 and 18 suffers almost no dimensional degradation during etching, the $SiO_2$ regions underlying these masking elements suffer virtually no lateral erosion. Accordingly, the widths of the exposed regions of the layer 10 correspond substantially exactly to the dimensions originally defined by the resist pattern. Hence, when etching of the layer 10 is subsequently carried out, utilizing the remaining $SiO_2$ regions as a mask, the pattern transferred into the layer 10 will be a highly faithful replica of the originally specified resist pattern.

Anisotropic etching of the layer 10 of FIG. 4 is done, for example, in a standard reactive sputter etching step employing a pure oxygen atmosphere at a pressure of about 5 $\mu m$, with an oxygen gas flow rate of about 12 cubic centimeters per minute and with the power input to the above-specified reactor being approximately 0.2 watts per square centimeter. In such a step, the resist pattern, including the elements 16 and 18 and the protective films 60 and 62 thereon, is removed while the pattern defined by the $SiO_2$ layer 14 is transferred into the relatively thick layer 10. Submicron resolution with essentially vertical walls in the layer 10 is thereby achieved. Thereafter, processing of the substrate 12 (or of a layer, not shown, interposed between the layer 10 and the substrate 12) is carried out utilizing the patterned thick layer 10 as a mask therefor, in a manner known in the art. Such subsequent processing includes, for example, ion implantation, diffusion, etching, metallization, etc.

An exact theory explaining the basis for the aforespecified selective deposition phenomenon discovered by applicants has not yet been formulated. One tentative explanation for the phenomenon is that during etching a polymer film derived from fluorine and hydrogen species in the plasma actually forms on both the masking resist elements and the unmasked or exposed $SiO_2$ regions. In accordance with that explanation, the film that tends to form on the $SiO_2$ is continually etched off the exposed regions by reactive and non-reactive sputtering thereby subjecting the $SiO_2$ regions to the plasma etching process. On the other hand, film formation on the surface of the resist material (which itself is a polymer) occurs in an enhanced manner that leaves a net film thickness in place thereon even though reactive and non-reactive sputtering of the film is also continually occurring there during etching. In turn, the polymer film thickness that persists on the resist pattern serves as an effective protective layer therefor.

Applicants' invention is not dependent on the aforespecified explanation. Whether or not that explanation is confirmed as being accurate, applicants' invention relies on the actuality that selective polymer formation and maintenance do in fact occur and can in practice be reliably and reproducibly utilized to significantly improve an important VLSI device fabrication sequence.

The fundamental aspect of applicants' inventive process is the establishment of both fluorine and hydrogen species in an etching plasma under controlled conditions designed to deposit and maintain a protective polymer film only on the surfaces of a masking resist pattern. Thus, although the introduction of nitrogen into the etching chamber from the gas supply is generally considered to be advantageous, its presence in the gas mixture is not necessary. In fact, $CHF_3$ alone is sufficient to achieve selective polymer deposition of the type specified herein when utilizing resists such as DCOPA, PBS or COP. For $CHF_3$ alone, it is advantageous to establish the following conditions in the FIG. 3 reactor to achieve such deposition: a pressure of about 10 $\mu m$, a gas flow rate of about 14 cubic centimeters per minute and a power input of approximately 0.15 watts per square centimeter.

Alternatively, $CHF_3+H_2$, or $CHF_3+N_2$, can be utilized in the FIG. 3 reactor to establish the selective polymer deposition phenomenon specified herein. For $CHF_3+H_2$, the following conditions are advantageous: a $CHF_3$ gas flow rate of about 11.6 cubic centimeters per minute and an $H_2$ gas flow rate of about 2.4 cubic centimeters per minute; a pressure of approximately 7 $\mu m$; and a power input of about 0.2 watts per square centimeter. For $CHF_3+N_2$, the corresponding parameters are: 14 cubic centimeters per minute ($CHF_3$), 2 cubic centimeters per minute ($N_2$), 15 $\mu m$ and 0.2 watts per square centimeter.

Finally, it is to be understood that the above-described techniques are only illustrative of the principles of the present invention. In accordance with these principles, numerous modifications and alternatives may be devised by those skilled in the art without departing from the spirit and scope of the invention. For example, although the primary emphasis herein has been directed to improving the etch selectivity between a resist mask pattern and an underlying layer made of $SiO_2$, it is to be understood that the principles of this invention also apply to the etching of an underlying layer made of other materials such as silicon nitride, boron nitride or boron-doped polysilicon of the type described in a commonly assigned copending application of A. C. Adams, F. B. Alexander, Jr., H. J. Levinstein and L. R. Thibault designated Ser. No. 178,988, filed Aug. 18, 1980. Moreover, although the principal practical applicability of the herein-described invention is presently considered to be in the aforespecified trilevel process, it is to be understood that the invention can be utilized for other purposes. Thus, for example, wherever a resist-masked layer of $SiO_2$ or one of the above-specified alternative materials is to be etched in a high-resolution way in a plasma-assisted process, the selective polymer deposition technique of this invention may be applicable thereto. Furthermore, it is apparent that the techniques described herein are not limited to the particular illustrative electron-sensitive and X-ray-sensitive resists specified above. These techniques are generally applicable to any VLSI fabrication process in which a thin high-resolution resist material is selectively irradiated and patterned to form an etching mask.

We claim:
1. A method of fabricating a VLSI device, comprising the steps of
forming a layer to be patterned,
depositing a resist layer on said layer to be patterned,
patterning said resist layer to define features therein, and, using said patterned resist layer as a mask, dry etching said layer to be patterned in a plasma-assisted etching step in which a protective polymer film is formed and maintained only on said patterned resist layer while said layer to be patterned is etched to define said device features therein.

2. A method as in claim 1 wherein said etching step comprises establishing in a reaction chamber a plasma that includes a fluorine and hydrogen species.

3. A method as in claim 2 wherein said etching step comprises introducing into said chamber a gas selected from the group consisting of $CHF_3$ and $CHF_3 + H_2$.

4. A method as in claim 2 wherein said etching step further comprises establishing a nitrogen species in said chamber.

5. A method as in claim 4 wherein said etching step comprises introducing into said chamber a gas selected from the group consisting of $CHF_3 + N_2$ and $CHF_3 + H_2 + N_2$.

6. A method as in claim 4 wherein said device to be fabricated is mounted on a cathode electrode within said chamber, said layer to be patterned is made of $SiO_2$, and said etching step comprises introducing into said chamber $CHF_3 + H_2 + N_2$;
establishing the following gas flow rates into said chamber: $CHF_3$—approximately 11.6 cubic centimeters per minute, $H_2$—approximately 2.4 cubic centimeters per minute and $N_2$—approximately 0.6 cubic centimeters per minute;
establishing a pressure within said chamber of approximately 7 $\mu m$;
and, by driving said cathode electrode via a capacitively coupled radio-frequency generator, establishing a power density of approximately 0.2 watts per square centimeter at the surface of said device.

7. A method as in claim 6 wherein said $SiO_2$ layer is approximately 0.12 $\mu m$ thick, said resist layer is approximately 0.35 $\mu m$ thick and is selected from a group consisting of DCOPA, PBS and COP, and said protective film is approximately 400-to-500 Angstrom units thick.

8. A method as in claim 7 wherein said $SiO_2$ layer is disposed on an organic layer approximately 2.6 $\mu m$ thick, and wherein, subsequent to the above-specified etching step, said organic layer is anisotropically etched in said chamber in a pure oxygen plasma etching step to transfer the device features defined in said $SiO_2$ layer into said organic layer.

9. A method of fabricating a VLSI device, comprising the steps of forming a layer (14) to be patterned,
depositing a resist layer on said layer (14) to be patterned,
patterning said resist layer (see, e.g., elements 16, 18) to define features therein,
and, using said patterned resist layer as a mask, dry etching said layer (14) to be patterned in a plasma-assisted etching step, characterized in that
in said etching step a protective polymer film (60, 62) is formed and maintained only on said patterned resist layer while said layer (14) to be patterned is etched to define said device features therein.

* * * * *